United States Patent [19]
Grove

[11] Patent Number: 6,097,586
[45] Date of Patent: Aug. 1, 2000

[54] VARIABLE CAPACITOR

[76] Inventor: Carel Martin Grove, 28 Station Road, Mursley, Milton Keynes, Bucks MK17 0SA, United Kingdom

[21] Appl. No.: 09/171,084

[22] PCT Filed: Apr. 22, 1997

[86] PCT No.: PCT/GB97/01100

§ 371 Date: Oct. 9, 1998

§ 102(e) Date: Oct. 9, 1998

[87] PCT Pub. No.: WO97/40506

PCT Pub. Date: Oct. 30, 1997

[30]     Foreign Application Priority Data

Apr. 24, 1996 [GB] United Kingdom ................... 9608581

[51] Int. Cl.$^7$ ............................. H01G 7/00; H03M 1/80
[52] U.S. Cl. ...................... 361/277; 361/280; 29/25.41; 307/110
[58] Field of Search .................. 361/277–279, 361/280, 281, 271; 307/109, 110; 29/25.41, 25.42

[56]             References Cited

U.S. PATENT DOCUMENTS 3,665,458   5/1972   Mulkey et al. .
4,095,162   6/1978   Hiddink .
4,549,312   10/1985  Michaels et al. ........................ 327/556
5,392,358   2/1995   Driver ..................................... 381/113

FOREIGN PATENT DOCUMENTS

| 570929 | 8/1977 | Russian Federation . |
| 769650 | 10/1980 | Russian Federation . |
| 783868 | 11/1980 | Russian Federation . |
| 303175 | 1/1930 | United Kingdom . |
| 659796 | 10/1951 | United Kingdom . |
| 886165 | 1/1962 | United Kingdom . |
| WO 82/03957 | 11/1982 | WIPO . |

OTHER PUBLICATIONS

Patent Abstracts of Japan, vol. 007, No. 258 (E–211) Nov. 17, 1983, JP 58142696 (Matsushita Denki Sangyo KK, Aug. 24, 1983).

*Primary Examiner*—Kristine Kincaid
*Assistant Examiner*—Eric Thomas
*Attorney, Agent, or Firm*—Merchant & Gould P.C.

[57]             ABSTRACT

A variable capacitor includes a first electrode (2), a second electrode (3) and, located between the first and second electrodes, an array of gas discharge tubes (7). The capacitor includes means for producing an electrical discharge in the tubes, thereby affecting the capacitance of the capacitor.

13 Claims, 17 Drawing Sheets

Graph showing voltage generated with polarisation

Graph showing voltage generated without polarisation

VARIABLE CAPACITOR

BACKGROUND OF THE INVENTION

This invention relates to a variable capacitor and to a method of varying the capacitance of a capacitor. The invention further relates to a digital-to-analog, converter and to an electrostatic loudspeaker.

Variable capacitors are widely used in electronics but have restrictions where high voltages or large capacitance ranges are required. Moreover, the value of the capacitor is adjusted mechanically, usually manually or by means of a servo motor. This limits the usefulness of the capacitors where automatic control is required or where very rapid changes in capacitance are necessary, with precision.

It is an object of the present invention to mitigate at least some of the afore-mentioned problems.

SUMMARY OF THE INVENTION

According to the present invention there is provided a variable capacitor including a first electrode, a second electrode separated therefrom and, located between the first and second electrodes, gas discharge means including an ionizable gas and means for producing an electrical discharge in the ionizable gas, thereby affecting the capacitance of the capacitor.

The present invention provides a capacitor whose capacitance may be adjusted electrically, according to analog or digital input signals, without the need for a mechanical interface. This allows the capacitance to be precisely adjusted automatically and with great rapidity. As the capacitor has no moving parts, it is also very reliable and needs minimal maintenance.

The capacitor is also capable of operating at high voltages, can provide a relatively large capacitance and has a large range of variation.

The gas discharge means may include a plurality of gas discharge tubes, said means for producing an electrical discharge in the ionizable gas comprising the electrodes of the gas discharge tubes.

The gas discharge tubes may be connected so as to permit the number of tubes activated to be controlled.

Advantageously, each of said first and second electrodes comprises a plurality of plate elements, the plate elements of the first electrode being interleaved with those of the second electrode.

Gas discharge means may be located between each adjacent pair of interleaved plate elements.

Voltage supply means may be connected to said gas discharge means and arranged to supply a voltage sufficient to activate said gas discharge means. Said voltage supply means may include control means for selectively activating a predetermined number of said gas discharge tubes. Alternatively or in addition, the voltage supply means may include control means for controlling the voltage applied to the gas discharge tubes. Alternatively, the voltage supply means may include means for modulating the voltage applied to the gas discharge tubes.

The present invention further provides a digital-to-analog analog converter including a variable capacitor including a first electrode, a second electrode separated therefrom and, located between the first and second electrodes, a plurality of gas discharge tubes, the gas discharge tubes being connected so as to permit the number of tubes activated to be controlled, and voltage supply means connected to the gas discharge tubes, the voltage supply means including control means for selectively activating a number of the gas discharge tubes in response to a digital input signal received by the control means.

Since the capacitance may be relatively large, analog power may be drawn from the capacitor. It may thus be employed as a digital-to-analog power transducer, without the need for a power amplifier.

According to the present invention there is further provided an electrostatic loudspeaker including a diaphragm, at least one electrostatic drive element. arranged to drive the diaphragm, the electrostatic drive element including a first electrode, a second electrode separated therefrom and, located between the first and second electrodes, a plurality of gas discharge tubes, and voltage supply means connected to the electrostatic drive element, the voltage supply means including control means for selectively activating a predetermined number of the gas discharge tubes in response to a digital input signal received by the control means.

The present invention further provides a method of varying the capacitance of a capacitor comprising a first electrode, a second electrode separated therefrom and, located between the first and second electrodes, gas discharge means including an ionizable gas and means for producing an electrical discharge in the ionizable gas, the method comprising controlling the electrical discharge produced in the ionizable gas.

Advantageously, the gas discharge means includes a plurality of gas discharge tubes and the electrical discharge is controlled by selectively activating a predetermined predetermined number of the gas discharge tubes. Alternatively, the electrical discharge may be controlled by adjusting the voltage applied to the gas discharge means, or by modulating the voltage applied to the gas discharge tubes.

The present invention yet further provides a method of converting a signal from digital to analog form by means of a variable capacitor including a first electrode, a second electrode separated therefrom and, located between the first and second electrodes, a plurality of gas discharge means, the method comprising applying a first voltage to the first and second electrodes, receiving a digital input signal, applying a second voltage to a predetermined number of the gas discharge means to activate the predetermined number of the gas discharge means, and controlling the number of activated gas discharge means in response to the digital input signal, thereby generating an analog variation in the charge carried by the capacitor.

BRIEF DESCRIPTION OF THE INVENTION

Embodiments of the invention will now be described, by way of example, with reference to the accompanying drawings, of which:

DETAILED DESCRIPTION OF THE INVENTION

Figure 1:
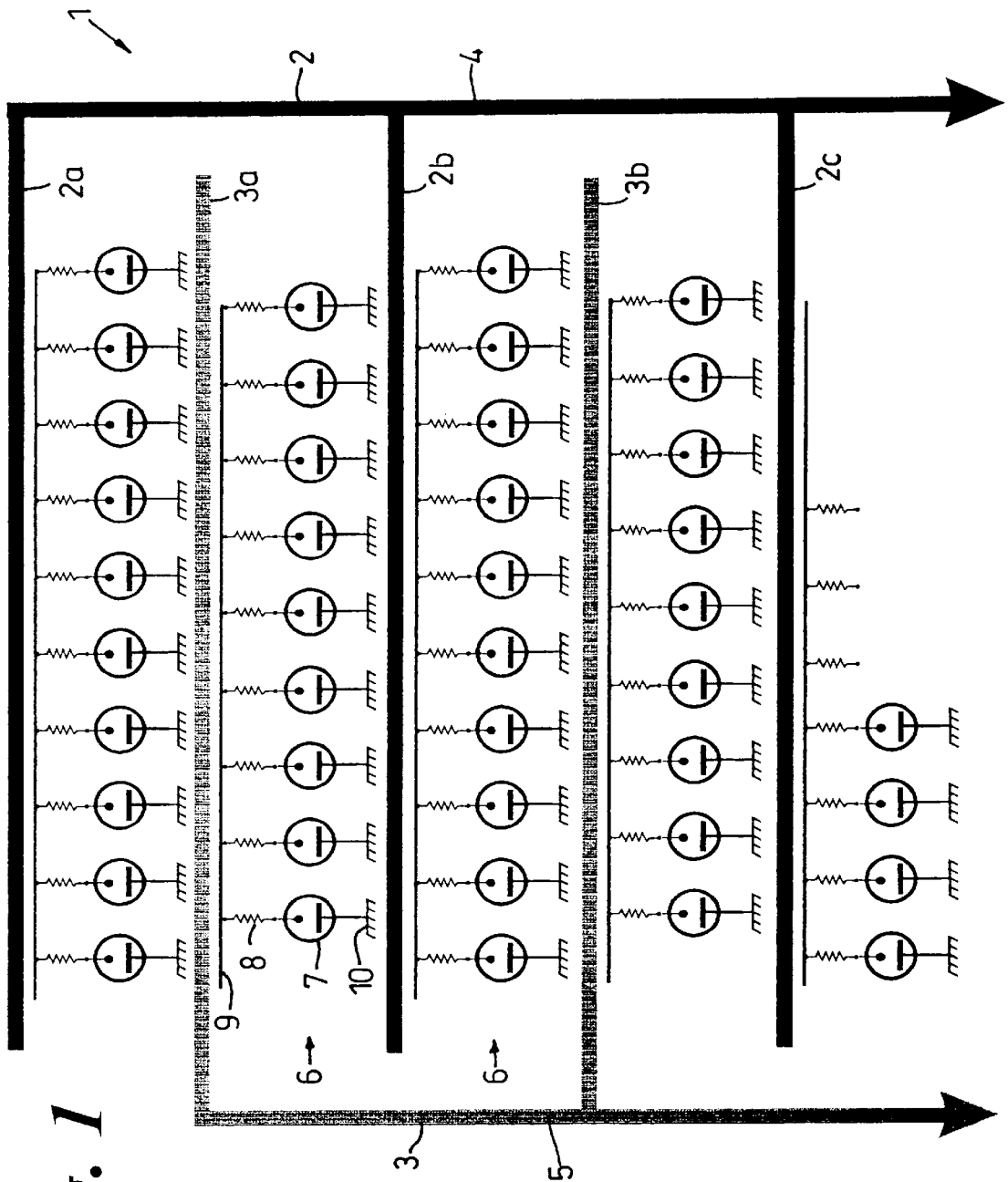
FIG. 1 is a schematic diagram showing the main components of the variable capacitor.

As shown schematically in FIG. 1, the capacitor 1 includes two electrodes 2,3, each of which comprises a set of parallel conductive plates. The plates 2a,2b,2c of the first electrode 2 are connected to a first conducting strip 4 and are interleaved with the plates 3a,3b of the second electrode 3, which are connected to a second conducting strip 5. In practice, each electrode 2,3 will typically include many more plates than are illustrated in FIG. 1 (for example, 10 or more plates), only a few of those plates being shown for clarity.

Located between each pair of adjacent plates, for example between plates 2a and 3a, there is provided a row 6 of miniature gas discharge tubes 7. One terminal of each tube 7 is connected via a 4.7 kΩ, 0.25 W load resistor 8 to a first connecting rail 9 and the other terminal of each tube is connected to a ground connection 10. The first connecting rail 9 is connected to a regulated DC power supply (not shown). When a suitable potential of approximately 80–100 V DC is applied to the rail 9, all the tubes 7 in that row are activated.

In the embodiment shown in FIG. 1, each row 6 of gas discharge tubes 7 is separate from the other rows and may be switched on or off independently of the other rows. It is possible, however, to connect all the rows together in parallel so that all the tubes may be switched on or off together. Alternatively, each tube 7 may be connected separately to the power supply, so that they may be activated individually.

Figure 2:
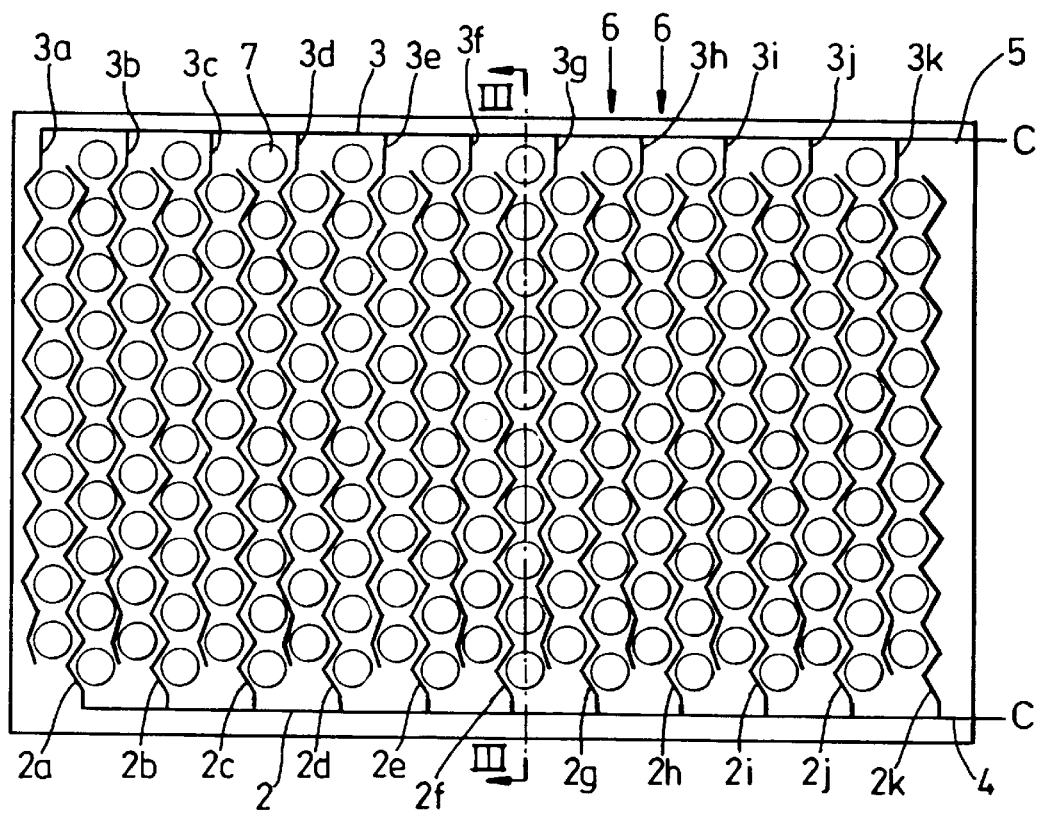
FIG. 2 is a plan view of a capacitor according to a first embodiment of the invention.
Figure 3:
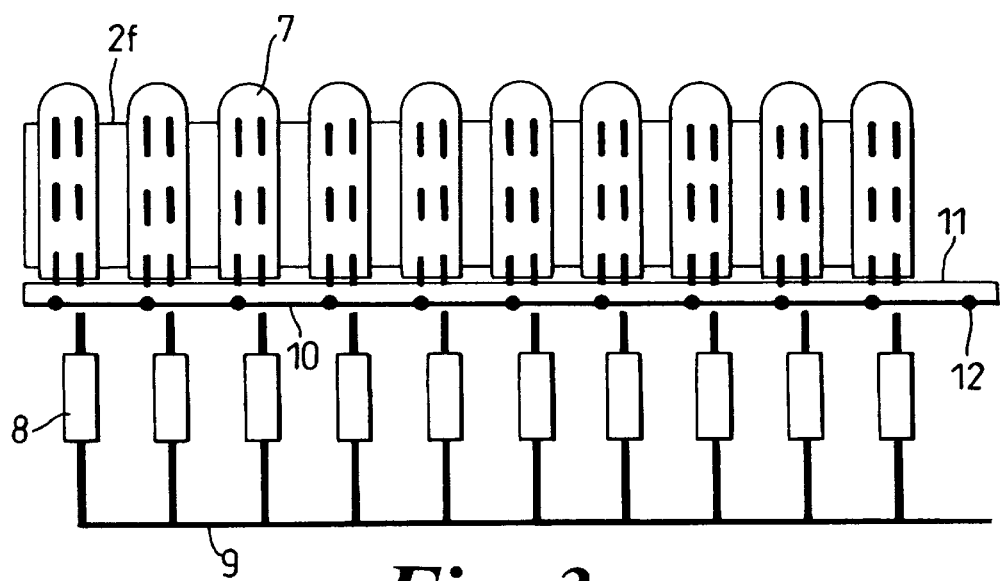
FIG. 3 is a cross-section along line III—III of FIG. 2.

A practical embodiment of the invention is shown in FIGS. 2 and 3. In this embodiment, each electrode 2,3 comprises eleven plates 2a–2k, 3a–3k that are manufactured from strips of copper and mounted on a printed circuit board 11 so that the plates 2a–2k of the first electrode 2 are interleaved with the plates 3a–3k of the second electrode 3. Each electrode 2,3 is connected to a respective connecting device CC'. The plates 2a–2k, 3a–3k have an undulating or zigzag form for reasons that are explained below.

A row 6 gas discharge tubes 7 is located between each adjacent pair of plates (for example, plates 2a,3a). In this embodiment, alternate rows have nine and ten tubes each, with the tubes of each row being located opposite the gaps between the tubes of the adjacent rows 6. This, and the zigzag form of the plates 2a–2k, 3a–3k, allows the rows 6 to be located as close to one another as possible, so reducing the spacing between the plates and increasing the capacitance of the capacitor.

As shown in FIG. 3, a first terminal of each tube 7 is connected via a load resistor 8 to a connection rail 9 and the second terminal of each resistor is connected via the ground plane 10 of the printed circuit board 11 to an earthing pin 12.

The tubes of each row 6 are thus connected in parallel and may be activated simultaneously by applying a suitable potential to that row. Each row may be activated independently of the other rows. Alternatively, as mentioned above, each tube 7 may have separate power supply connections to allow the tubes to be activated independently. The rows 6 of tubes 7 are hereinafter collectively referred to as the array 13.

The performance of the capacitor was tested using the circuit arrangements shown in FIGS. 4 to 7, where:

PSU is a regulated power supply unit 15 delivering up to 100 V DC (adjustable),

AM is an a stable multivibrator 16 with adjustable frequency,

OSC is an oscilloscope 17,

Tl is a mains isolating transformer 18,

TS is a transistor switch 19, and

Cx is the capacitor 1 under test.

Figure 4:
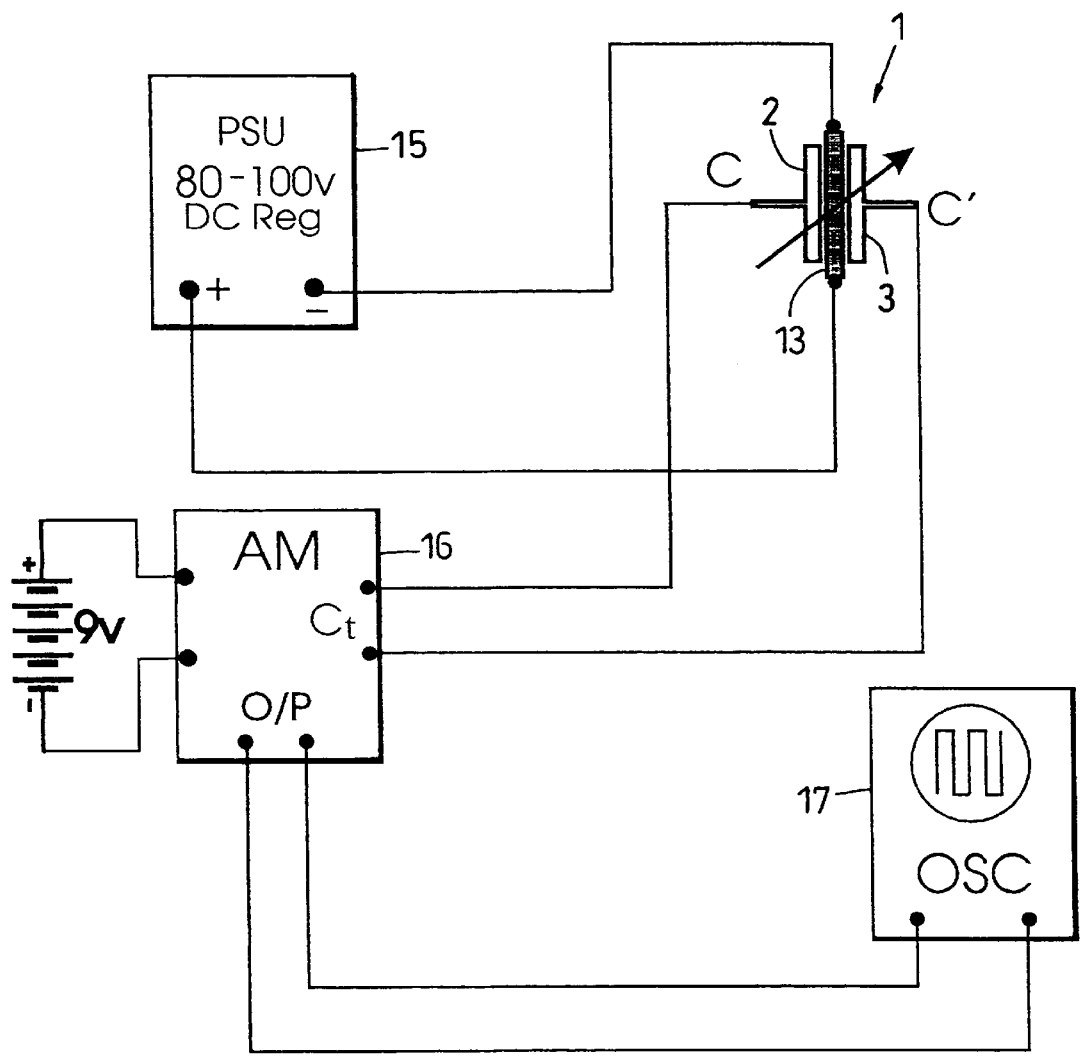
FIGS. 4, 5, 6 and 7 are circuit diagrams showing first, second and third arrangements for controlling and testing the performance of the capacitor.

In the first test, made using the circuit arrangement shown in FIG. 4, the variable capacitor 1 was substituted for the timing capacitor of the multivibrator 16. The array 13 of tubes was connected to the power supply unit 15 and supplied with power at potentials of 85 V, 90 V and 95 V DC. The number of tubes activated was varied and the capacitance of the capacitor determined from the frequency of the multivibrator output, which was observed using the oscilloscope 17.

Figure 8:
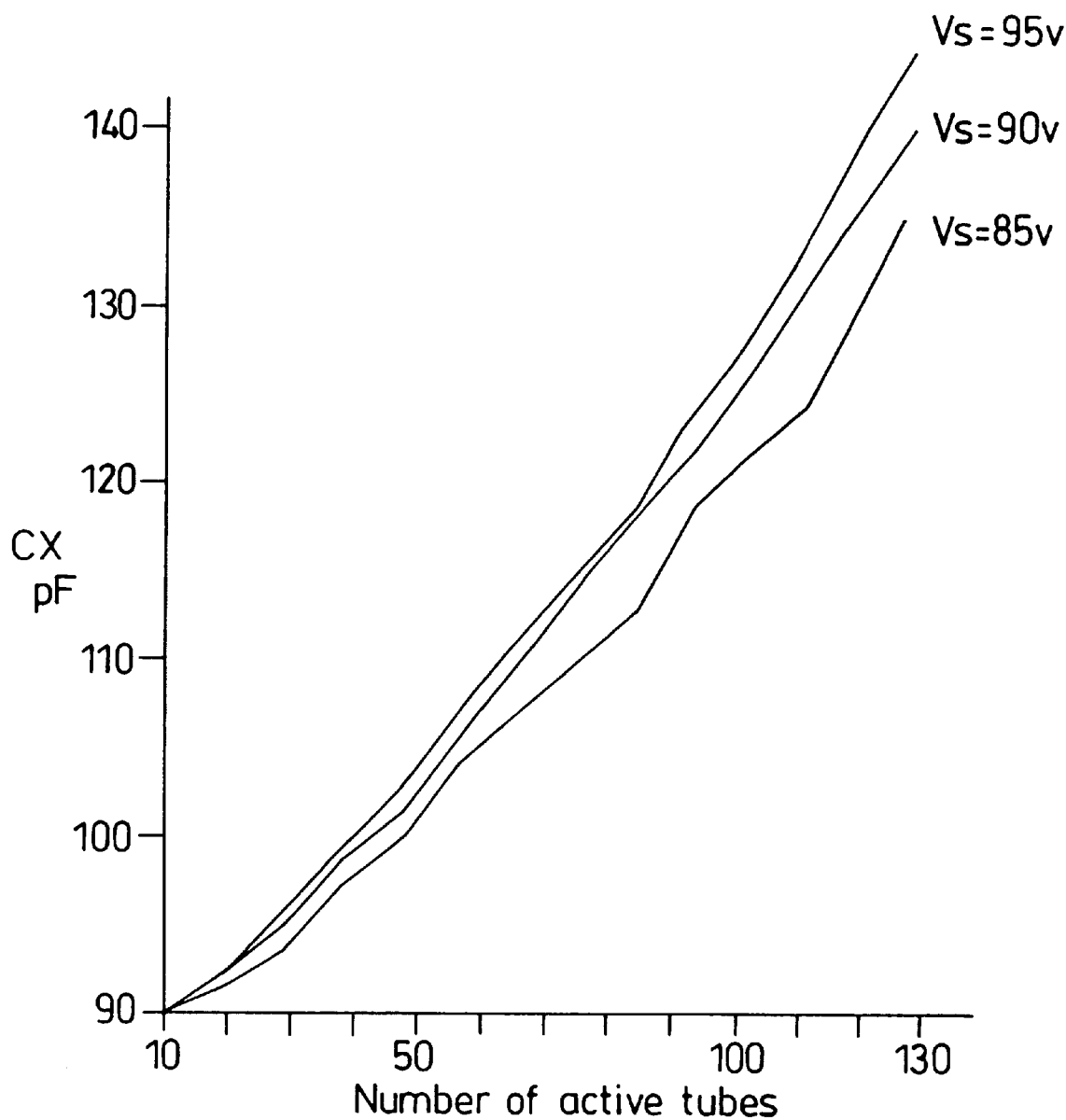
FIGS. 8 to 12 are graphs showing the results of tests into the characteristics of a capacitor according to the invention.

The results of the first test are shown in FIG. 8. As may be seen, the capacitor 1 has a basic capacitance of about 90 pF in its inactive state (with no tubes activated) and this increases to about 140 pF with 130 tubes activated.

Increasing the voltage supplied to the tubes also increased the capacitance somewhat.

Figure 5:
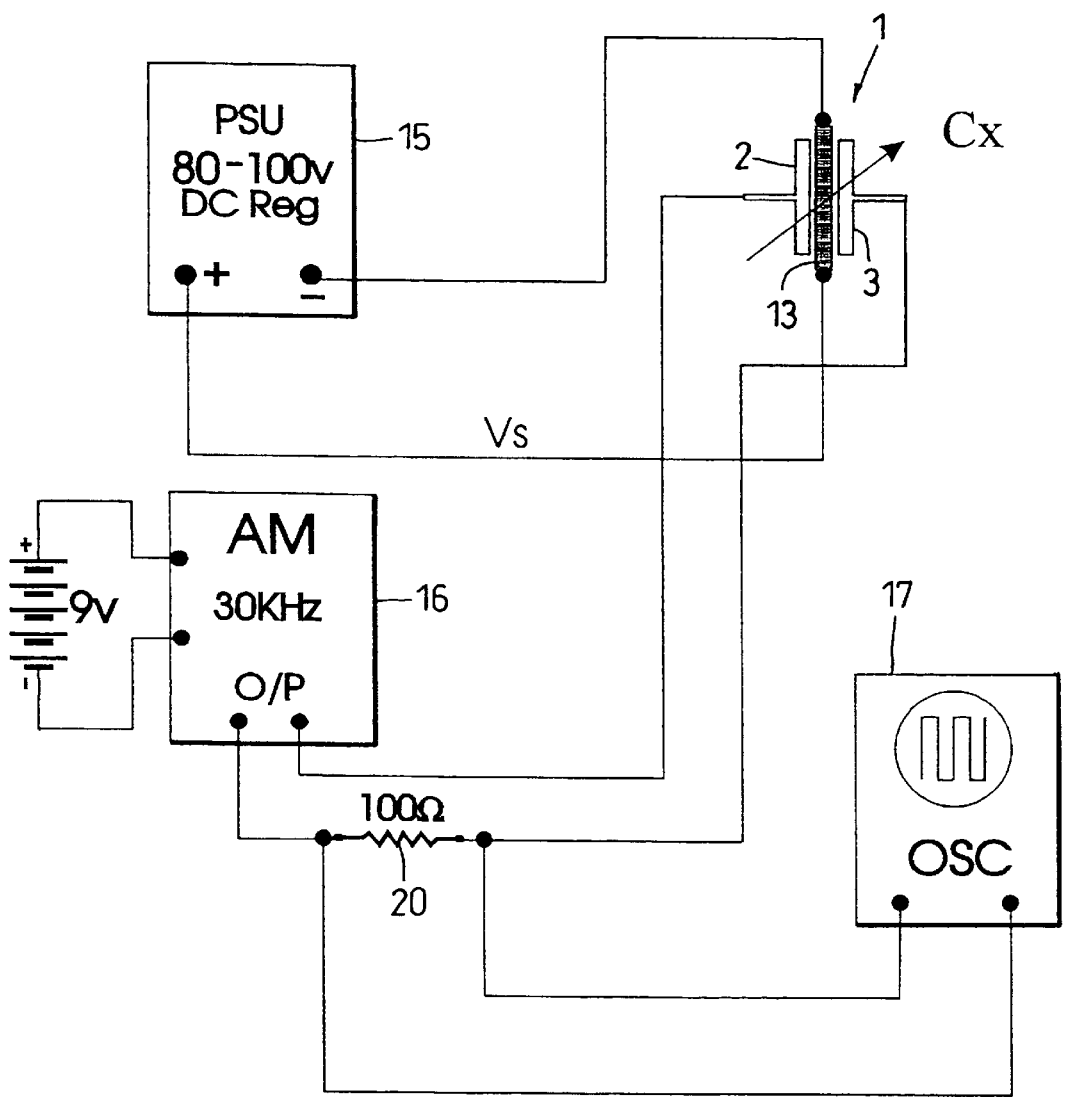

In the second test, using the circuit arrangement shown in FIG. 5, the array 13 of tubes was supplied with power at a potential of 90 V and the number of tubes activated was varied. The output of the multivibrator 16 was connected to the electrodes 2,3 of the capacitor 1 via a 100 Ω series resistor 20. The reactance of the capacitor 1 at a frequency of 30 kHz was measured by means of an oscilloscope 17 connected across the series resistor 20.

Figure 9:
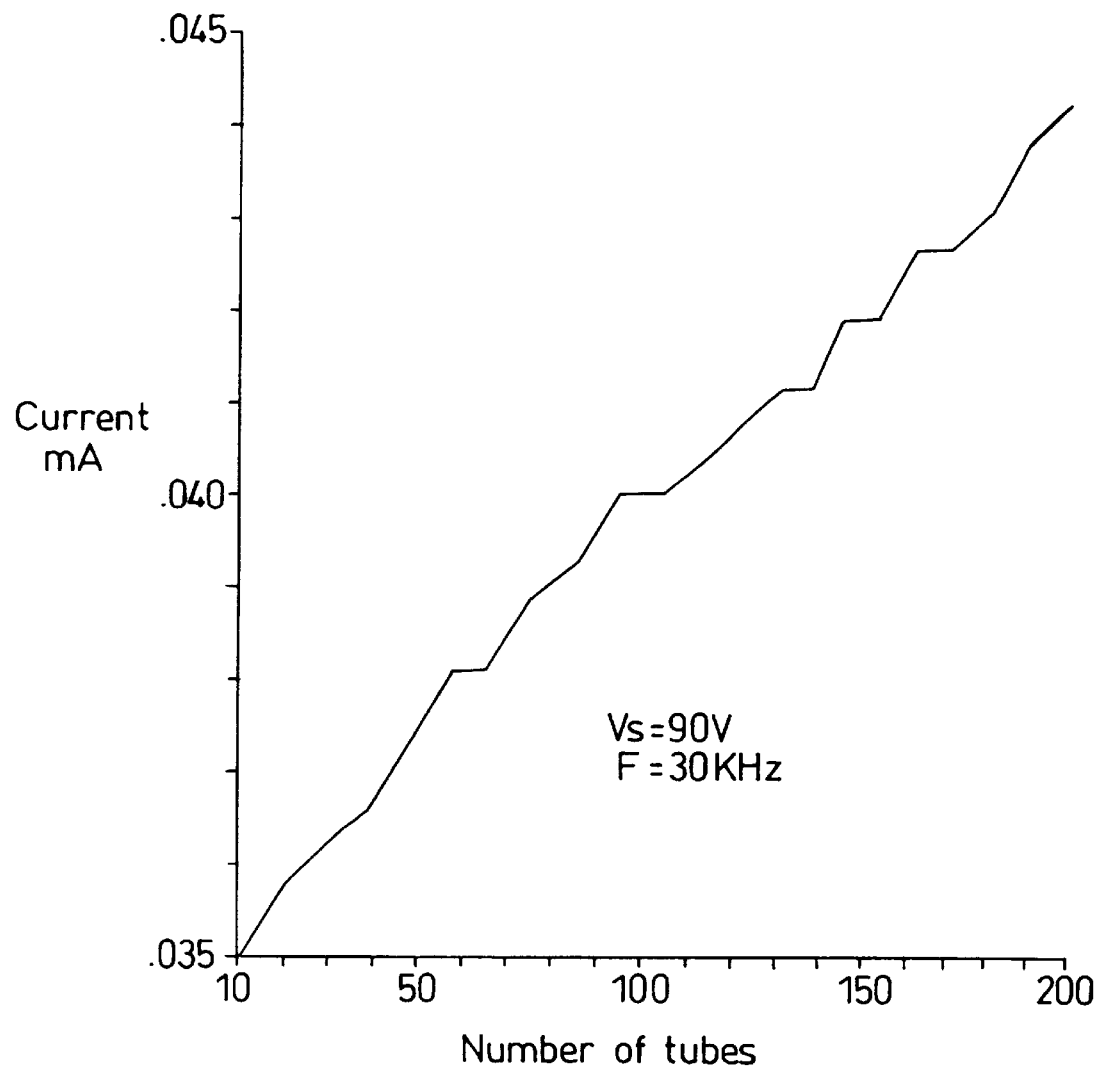

The results of the second test are shown in FIG. 9. As may be seen, the capacitor 1 exhibited decreasing reactance as the number of activated tubes increased.

Figure 6:
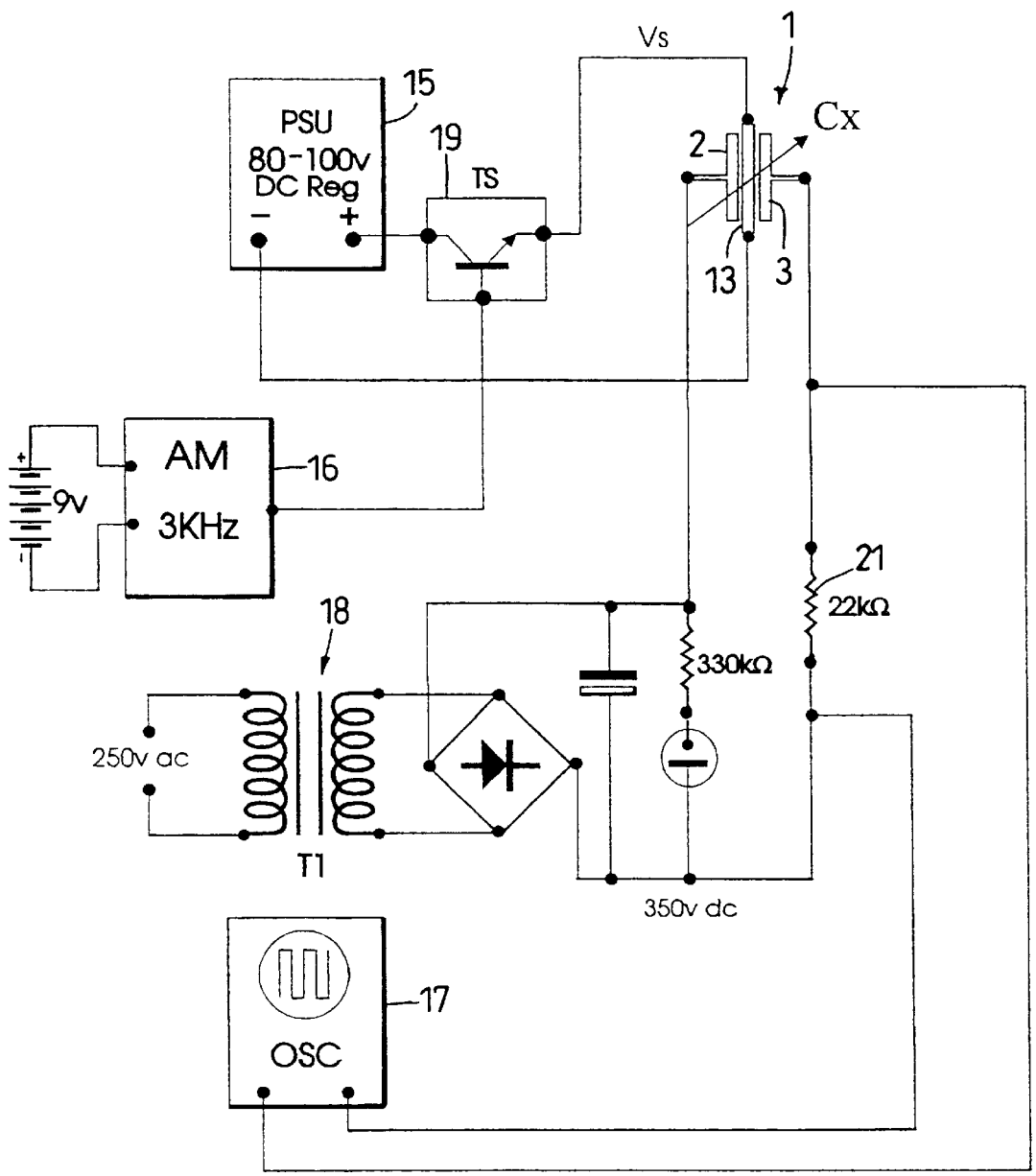
Figure 10:
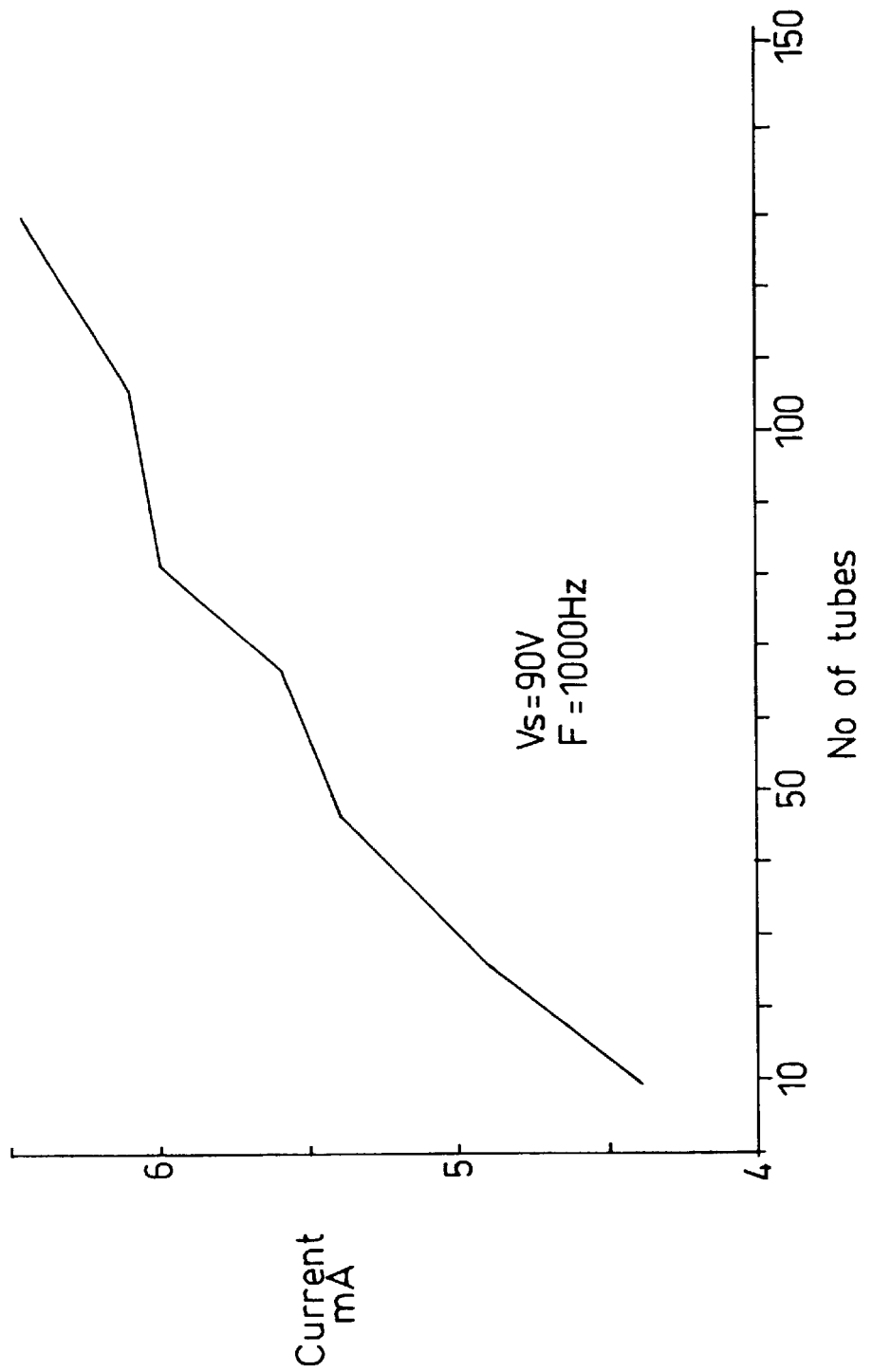

In the third test, using the circuit shown in FIG. 6, the output from the power supply unit 15 was delivered to the array 13 of tubes through a transistor switch 19, which was modulated by the output of the multivibrator 16. This allowed pulsed power to be delivered to the tubes, at a frequency of 1 kHz. The electrodes 2,3 of the capacitor 1 were charged to 350 V, DC and the change in reactance measured across a 22 kΩ series resistor 21. Once again the reactance decreased with the number of tubes activated, as shown in FIG. 10. Concurrent with the rise in current through the series resistor 21, there was an increase in current flow to the array 13 of tubes.

Figure 11:
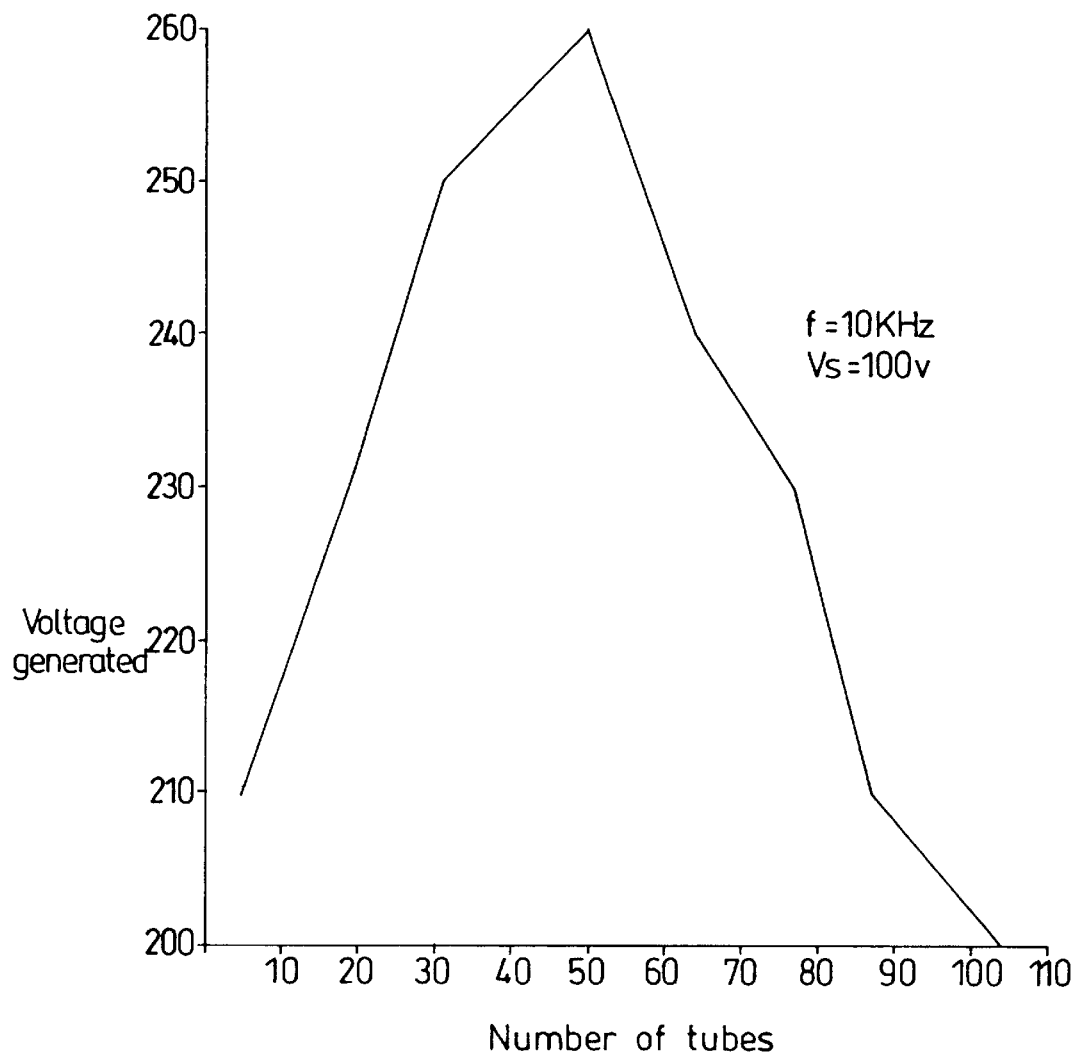

In the fourth test, the uncharged and isolated electrodes of the capacitor were connected to an oscilloscope and a 100 V, 10 kHz AC switching voltage was applied to the tubes, It was discovered that an almost exact replica of the switching waveform was generated at the terminals of the capacitor, even though the capacitor was not itself connected to a voltage supply. The voltage generated at the terminals of the capacitor was in phase with the switching waveform and about 38 V in magnitude, although the magnitude varied slightly with the number of tubes activated, as shown in FIG. 11.

It is speculated that the initial rise in potential with increasing numbers of active tubes probably represents a saturation process, preceding behavior as a proper capacitor, although a full explanation of the phenomenon cannot yet be provided. The energy contained in the secondary voltage is considered to represent the transfer function from the gas discharge to the plates. It is anticipated that the subsequent decline in voltage increasing numbers of active tubes would have continued had more tubes been available.

In order to estimate the current supplied under these conditions the capacitor was connected to a variable resistor. This resistance was reduced progressively until the output voltage from the capacitor was halved, i.e. 19 V. This corresponded to a resistance of 3.7 kΩ, which equated to approximately 5 mA and therefore to a power output of 100 mW. Considering that less than 10% of the available surface area of the capacitor was modified by the gas discharge, it is clear that the device will be capable of substantial power output if constructed for higher efficiencies.

Figure 7:
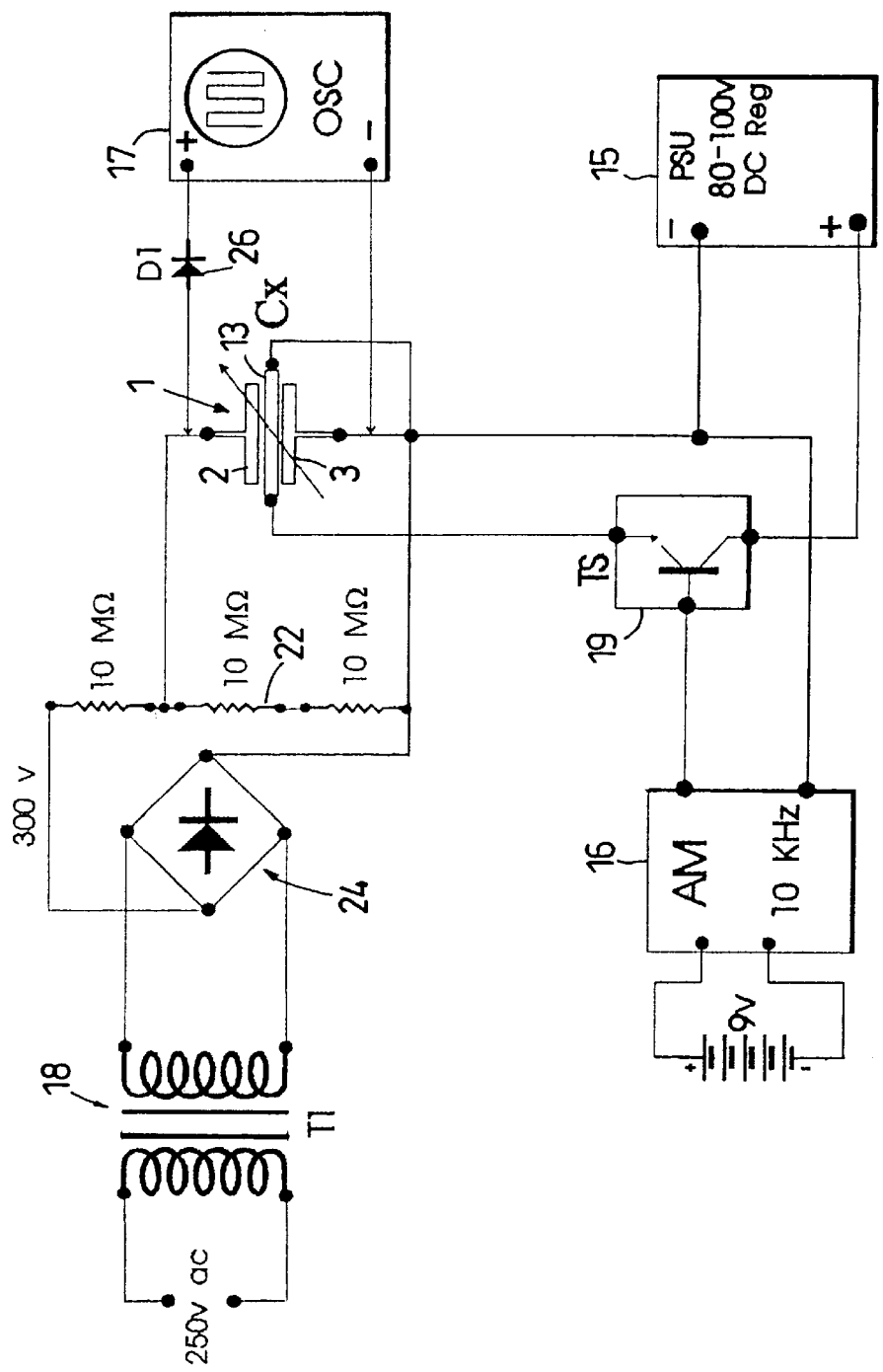

In the fifth test, using the circuit arrangement shown in FIG. 7, the electrodes 2,3 of the capacitor were connected via a-voltage divider 22 to a rectifier 24 and charged with 200 V DC. The voltage across the capacitor 1 was measured using an oscilloscope 17, which was connected to the. capacitor through a reverse biassed diode 26, to preserve charge. The array of tubes 13 was connected via a transistor switch 19 to a 100 V DC power supply unit 15. The transistor switch 19 was driven at a frequency of 10 kHz by an a stable multivibrator 16.

Figure 12:
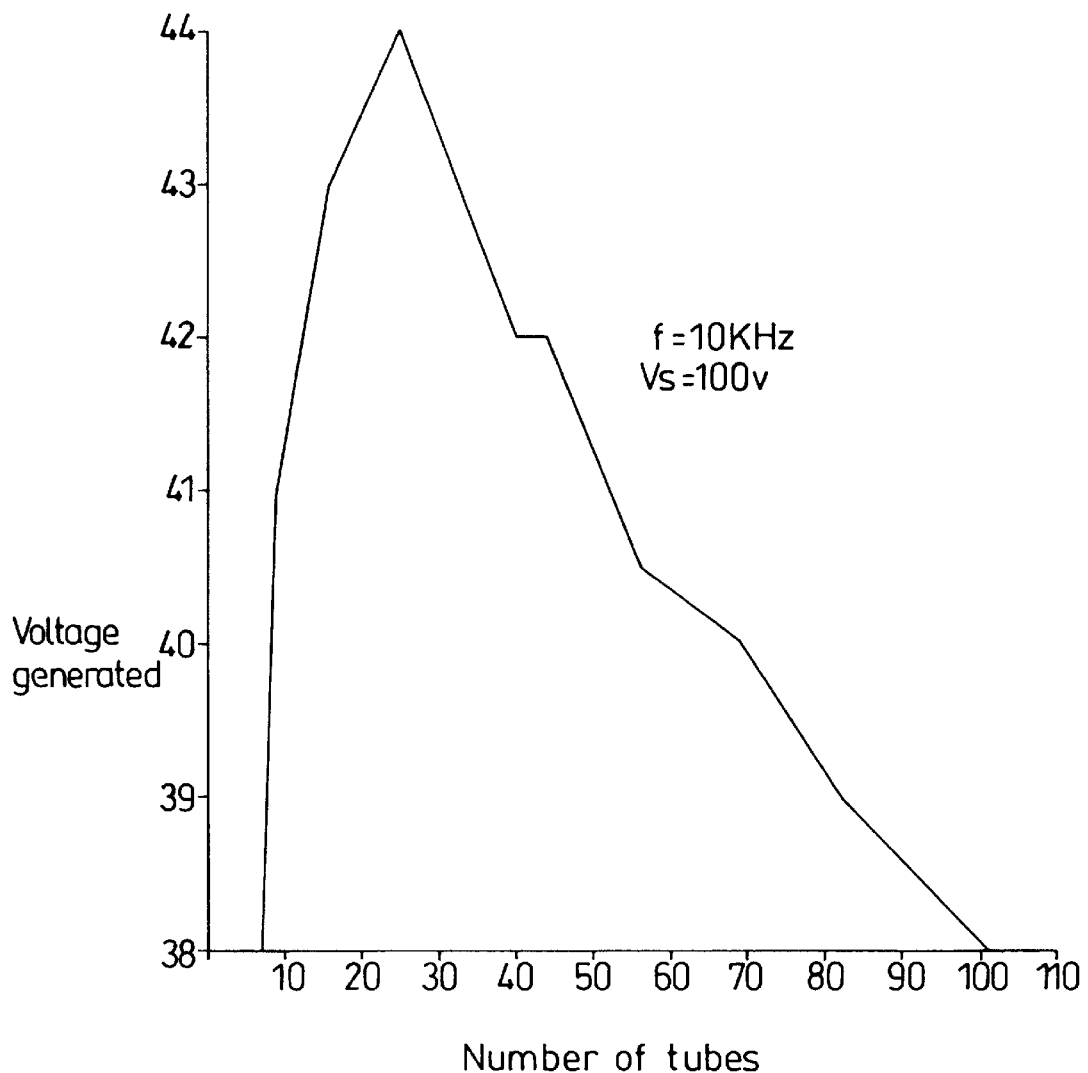

The results of the fifth test are shown in FIG. 12. The results are somewhat similar to those shown in FIG. 11, except that the potential difference is much higher. The voltage excursion can therefore clearly be increased by applying a polarizing voltage to the plates of the capacitor. This has the benefit of increasing the available energy in the capacitor, since this is proportional to the square of the voltage (as given by the equation $W=\frac{1}{2}CV^2$). Again, it is not clear at this stage what causes this phenomenon, although speculation surrounds the possibility that it may be related to a photovoltaic effect, radio frequency transmission or induction, or a combination of those factors.

Many possibilities exist to enhance the performance of the device. Some of these are described below:

The diameter of the tubes 7 may be reduced. This would allow greater density of tubes per unit area, thus allowing a larger proportion of the plates of the capacitor 1 to be occluded by the region of electrical discharge within the tubes. In addition, reducing the diameter of the tubes 7 will allow closer spacing of the capacitor plates, resulting in a larger capacitance per unit area.

The area of the cathode in the tubes 7 may be increased. It is believed that the enhancing effect of the tubes on the capacitance of the capacitor is generated by the plasma envelope around the cathode. If the area of the cathode were to be increased in relation to the diameter of the tube, a further improvement to the effect could be expected. By coating the inside surface of the tube with an electrically conductive layer to constitute the cathode, the plasma cloud would occupy practically the entire diameter of the tube. By controlling the resistivity of this layer it could be made to constitute the load resistor as well. The anode would occupy the central axis of the tube and would be of minimum diameter.

Suitable ionizing substances may be introduced in the tubes 7. It is believed that the effect on the capacitance is enhanced by greater numbers of ions in the gas. Ionizing substances could be introduced in the gas, or as a coating in the tubes 7.

The materials chosen for the electrodes of the capacitor may be selected to enhance the effect. There may be an advantage in using conductors with photo-voltaic properties for the plates of the capacitor, to capitalize on the light emitted from the tubes.

Figure 13:
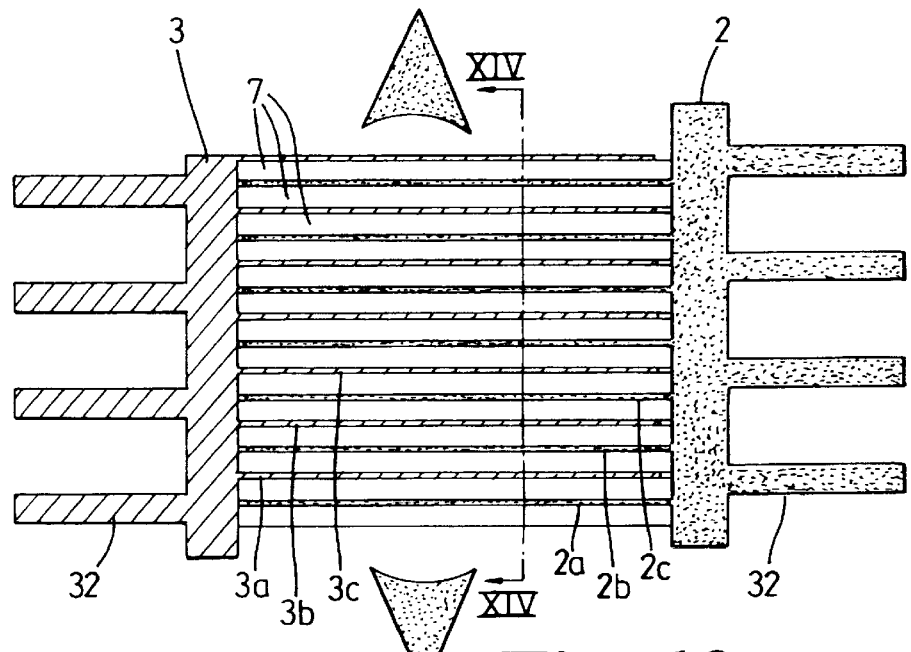
FIG. 13 is a side view of a capacitor according to a second embodiment of the invention.
Figure 14:
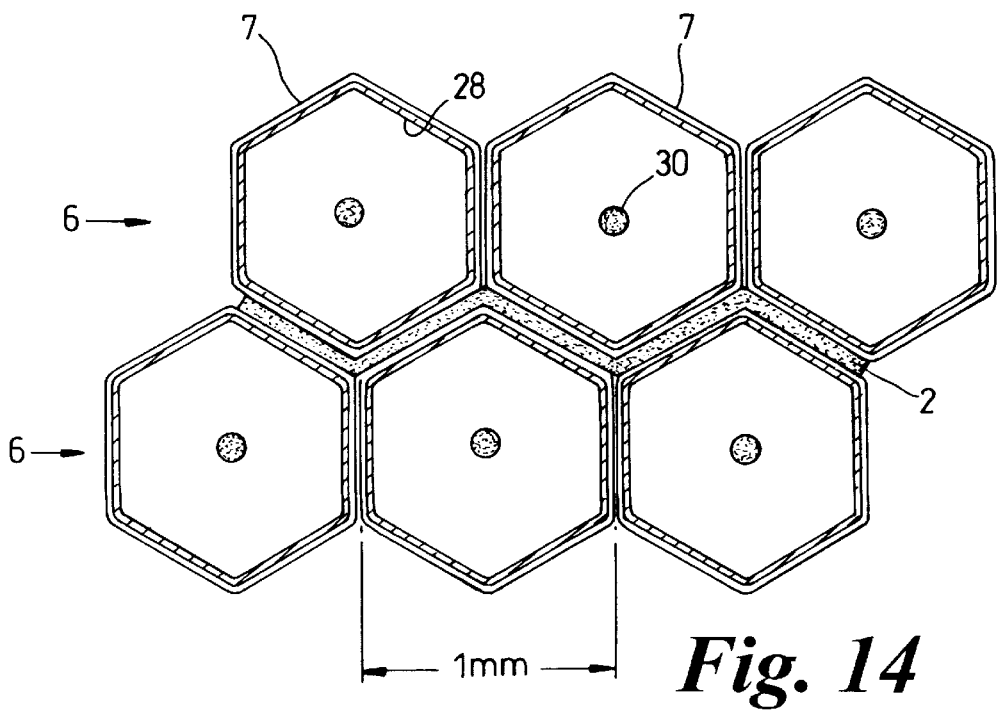
FIG. 14 is a cross-section along line XIV—XIV of FIG. 13.

One possible design based on the above points is shown in FIGS. 13 and 14. In this embodiment, the tubes 7 are elongate and hexagonal in cross-section. Each row 6 is made up of a number of such tubes 7, laid edge to edge. The cathode 28 is formed on the inner surface of each tube and the anode 30 runs along the central axis of the tube, so that when the tube is activated, the plasma fills substantially the entire volume of the tube.

The plates 2a,2b,2c and 3a,3b,3c etc. of the electrodes 2,3 are tightly interposed between the rows of tubes and have a zigzag or undulating form, to provide a high packing density and minimum plate separation. On their outer surfaces, the electrodes 2,3 are provided with fins 32, for good heat dissipation.

As explained above, the capacitance of the capacitor depends on the number of tubes activated. The capacitor may be used to supply power and, as the number of tubes activated may be controlled digitally, this allows the capacitor to be used as a digital-to-analog power converter.

For example, assuming that the tubes have a diameter of approximately 1 mm and a length of 20 mm, a total of 65536 tubes required for 16-bit digital conversion would occupy an area of 256 mm×256 mm. The resting capacitance (with no tubes activated) would be approximately 25 nF and if a ten-fold change in capacitance (i.e. a change of 225 nF) could be effected, this would produce an energy change of approximately 2.8 J at 5 kV. This could be increased by increasing the length of the tubes, or by connecting a number of capacitors in parallel.

A further application of the digital capacitor relates to its possible use as a digital-to-analog converter (DAC) or decoder, for example for use in a compact disk player. In the case of a 16-bit decoder, the capacitor would be arranged to receive 16-bit digital data along sixteen parallel lines. The first of those lines, which carried the least significant data bit, would be connected to one gas discharge tube, the second line would be connected to two tubes, the third to four tubes, the fourth to eight tubes and so on. Altogether, 65536 ($2^{16}$) tubes would be required.

By activating the tubes in accordance with the digital data received on the sixteen parallel lines, the capacitance of the capacitor can be varied in direct proportion to the value of the digital data. The digital data can thus be decoded and converted directly into a voltage to drive an amplifier or a speaker directly.

Frequencies of up to 44 kHz are required for audio purposes and as gas discharge tubes have switching rates of up to 80 kHz, these should be more than adequate for such purposes. This also allows for the possibility of running the device at, say, 60 kHz and interposing values calculated from real; data at the revised clock rate.

It may be possible to increase the switching rate further by using different gases, such as helium, in the gas discharge tubes.

A 16-bit decoder may be constructed as a 256×256 matrix, although it would preferably be slightly larger than this, for example as a 300×300 matrix, so that there are some spare tubes. Some of these tubes may be permanently activated to provide a "bias", offsetting the non-linear performance of the capacitor in the pre-saturation part of the performance curve, and others may be made available to replace faulty tubes. Yet others may be used to provide compensation for any non-linearities that may be present in the device as a whole. This compensation can be hard-wired during manufacture or provided as a software feature.

A possible construction of a 16-bit digital-to-analog converter (DAC) is shown in FIGS. 15 to 19. The basic functional element of the DAC comprises a digital capacitor unit 34, which includes a pair of capacitor plates and a plurality of individually addressable gas discharge tubes.

The digital capacitor unit 34 is constructed from a sandwich of four thin plates of a non-conductive substrate material, such as glass. These plates will be referred to in the following description as the top plate 36, the upper inner plate 38, the lower inner plate 40 and the bottom plate 42. It will be understood, however, that the device may be operated in any orientation and the terms "top", "upper", "lower" and "bottom" are used herein purely for ease of reference.

Figure 15:
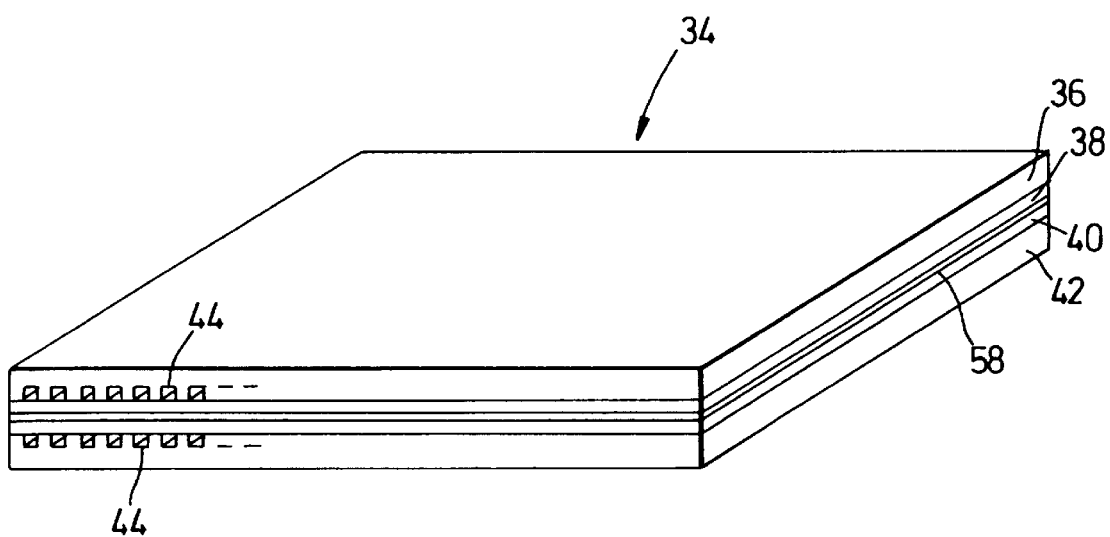
FIG. 15 is a perspective view of a capacitor according to a third embodiment of the invention.
Figure 16:
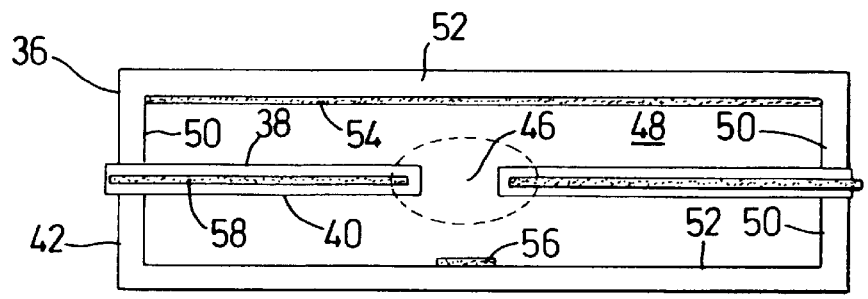
FIGS. 16 and 17 are cross-sectional views of a basic element of the capacitor shown in FIG. 15.
Figure 17:
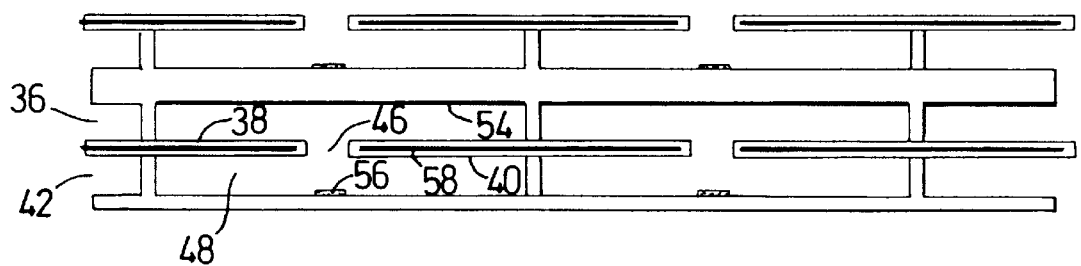

The vertical dimensions of the plates 36–42 are exaggerated in FIG. 15 for the sake of clarity. In practice, all four plates 36–42 will be made as thin as possible to reduce the overall dimensions of the device. The total thickness of the device 34 may, for example, be approximately 1–3 mm.

The top and bottom plates 36,42 are each provided on their inner faces with a plurality of parallel grooves 44, each of which may be for example 0.5 mm wide and 20 mm long. A total of 256 grooves 44 may be provided on each plate 36,42 (only some of which are shown in FIG. 15). Each groove 44 in the top plate 36 lies directly above a corresponding groove 44 in the lower plate 42 and each such pair of grooves 44 are connected to one another by perforations 46 that extend perpendicularly through the inner plates 38,40. Each pair of grooves 44 thus forms a single rectangular chamber 48 for ionizable gas.

The grooves 44 in the top and bottom plates 36,42 are rectangular in cross-section, each such groove comprising two side walls 50 and an end wall 52. A conductive element 54 is provided on the end wall 52 of each groove 44 in the top plate 36, the conductive element covering substantially the entire surface of the end wall 52. This conductive element 54 serves as the cathode of the gas discharge tube and also as the negative terminal of the capacitor unit 34.

A conductive element 56 is also provided on the end wall 52 of each groove 4 in the bottom plate 42. This conductive element 56 extends substantially the entire length of the groove 44 but is very narrow for minimal capacitive load. The conductive element 56 serves as the anode of the gas discharge tube and is connected via an electronic switch (not shown) to a power supply for activating the gas discharge tubes.

Sandwiched between the two inner plates 38,40 there is provided a third conductive element 58, which serves as the positive terminal of the capacitor unit 34. This third conductive element 54 may for example be formed by deposition of a conductive layer on one of the inner plates 38,40. The conductive element 58 does extend to the edges of the perforations 46 and it is thus insulated from the ionizable gas in the discharge tubes.

The perforations 46 may serve as load resistors for the gas discharge tubes, by mechanically restricting the flow of gas ions between the upper and lower halves of each gas discharge tube. For this purpose, the size of the perforations must be selected according to criteria such as the potential difference, the current, the size of the molecules and the pressure of the gas. The perforations 46 may also serve as a series inductive load to the current through the tubes, to offset the capacitative load.

Each digital capacitor unit 34 is provided with a frame (not shown) that provides the electrical connections for the conductive elements 54,56,58. As it has a relatively large surface area, the capacitor unit has plenty of room for the electrical connections.

The digital capacitor unit 34 described above has 256 individually addressable gas discharge tubes. A 16-bit decoder would thus consist of a stack of 256 such units. Alternatively, the decoder may consist of sixteen 64×64 stacks., which may be arranged as shown in FIGS. 18 and 19.

Figure 18:
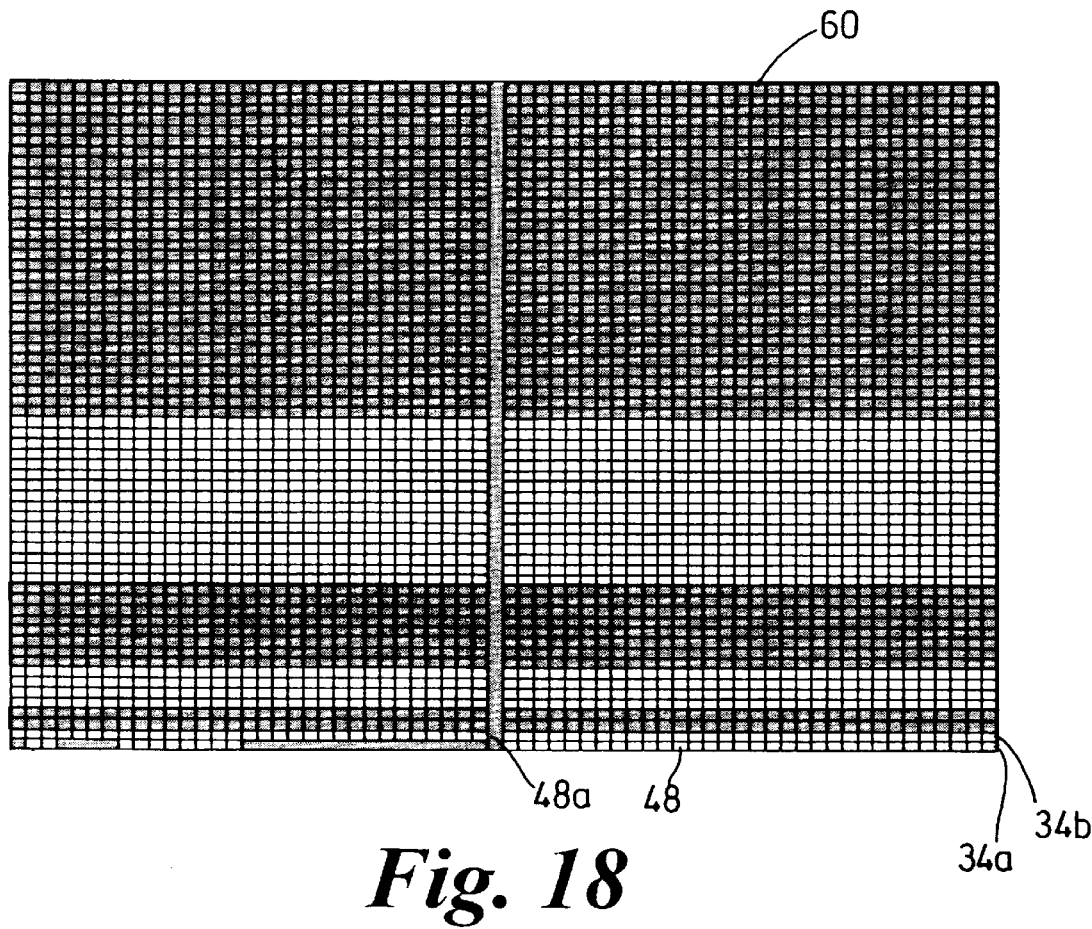
FIG. 18 is a side view of a stack of digital capacitors.
Figure 19:
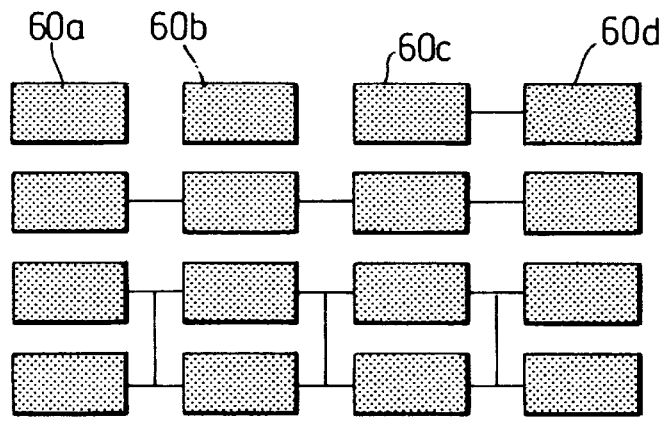
FIG. 19 is a diagrammatic view of an array of stacks, comprising a digital-to-analog converter.

Referring to FIG. 18, there is shown a side view of a single 64×64 stack 60, consisting of 64 digital capacitor units 34, each of which has 64 individually addressable gas discharge tubes 48. At least one tube 48a in each unit 34 will preferably be permanently lit to provide an offset bias and a source of ions to aid striking.

The first, least significant, bit is represented by the first gas discharge tube of the first plate, the second bit is represented by the next two tubes, the third bit by the next four tubes and so on. The first six bits are therefore represented by the tubes of the first digital capacitor unit 34a, the seventh bit by the entire second digital capacitor unit 34b, the seventh bit by the third and fourth digital capacitor units 34c,34d and so forth. Altogether, the stack 60 of 64 digital capacitor units 34 acts as a twelve bit decoder.

A sixteen bit decoder comprises sixteen such stacks. As shown in FIG. 19, the first stack 60a represents the first twelve bits, the second stack 60b represents the thirteenth bit, the third and fourth stacks 60c,60d represent the fourteenth bit, and so on.

Various modifications of the invention are possible: for example, instead of arranging the digital capacitor unit 34 so that the grooves in the top plate are parallel to those in the bottom plate, the top plate may be turned through 90° so that the grooves lie perpendicular to one another. This will give the device improved mechanical strength and will ensure that some ions are present in all channels, to assist reliable striking.

Figures 20, 21:
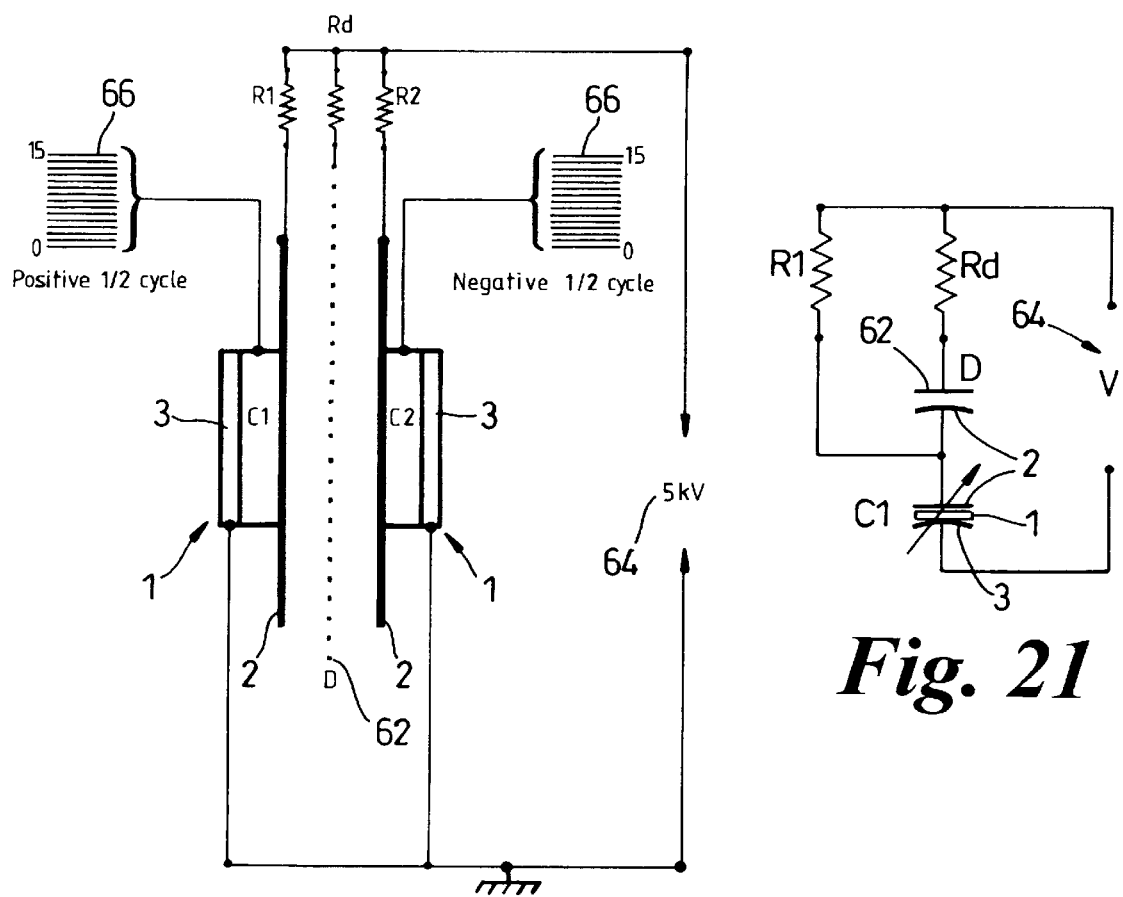
FIGS. 20 and 21 are a schematic diagram and a circuit diagram of an electrostatic loudspeaker according to the present invention.

The DAC may be employed for example as the drive for a digital loudspeaker. As shown in FIGS. 20 and 21, the loudspeaker may be based on a conventional electrostatic loudspeaker and includes an electrically conductive diaphragm 62 that is mounted in the gap between two variable capacitors 1 and is charged by a high voltage source 64 through its built-in resistivity Rd. The inner plates 2 of the capacitors 1 are similarly charged through high value resistors R1 and R2. The outer electrode 3 of each capacitor is connected to the negative terminal of the power supply, which is earthed.

The array 13 of tubes of each capacitor 1 is connected to a digital control device 66 that supplies digitally encoded positive half cycles to one of the arrays 13 and digitally encoded negative half cycles to the other array. The capacitance of the capacitors, and hence the electrical charge carried by the capacitors, is thus digitally controlled. As the charge carried by the capacitors varies, the diaphragm 62 is affected by the electrostatic field between the capacitors and thus vibrates in accordance with the digital signals supplied to the capacitors.

Since each half cycle is represented by 16 bits, the complete signal will have the equivalent of 17 bit resolution. Assuming that a 250 nF capacitor could be manufactured according to the techniques described above, and that a twenty-fold enhancement is possible, this represents a potential capacitance change of 4750 nF. This would produce an energy output of 60 J per half cycle at 5000 V.

The invention thus provides for the possibility of a true digital loudspeaker. Power amplification in the conventional sense is avoided. Instead, the DAC is powered up to maximum energy and then tapped of only enough to move the diaphragm. Tone and volume control can be achieved through software.

Figure 22:
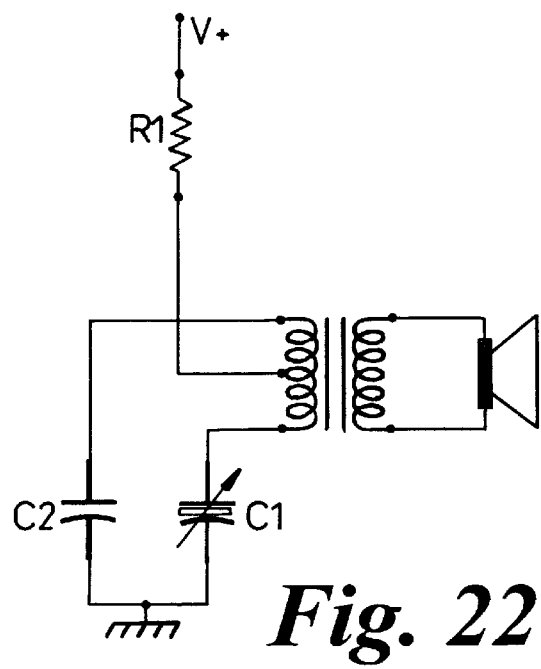
FIGS. 22 and 23 are circuit diagrams of circuits for driving low impedance loads.
Figure 23:
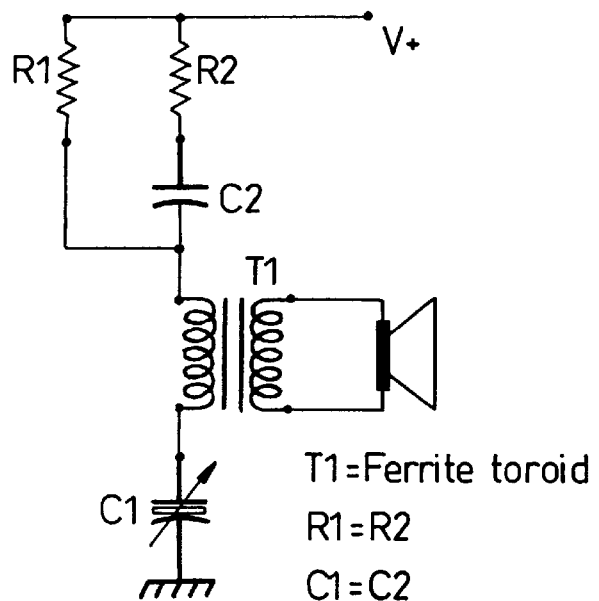

The digital capacitor may also be used for driving low impedance loads. Suitable circuits are shown in FIGS. 22 and 23, in which R1 and R2 are high value resistors, C2 a conventional HV capacitor and T1 a transformer (for example a ferrite transformer). Varying the capacitance of the digital capacitor C1 causes a current to flow through the primary coil of the transformer T1, thereby generating a voltage in the secondary coil.

The invention may also find a use in any application where digital control of power is required. For example, the capacitor may be used for motor control or as a video decoder, for example for driving a flat panel display. An operating frequency of up to 44 MHz may be required for such applications, and Helium is probably the most suitable gas for the discharge tubes.

Further modifications and applications of the invention will be apparent to those skilled in the art.

I claim:

1. A variable capacitor including a first electrode, a second electrode separated therefrom and, located between the first and second electrodes, gas discharge means comprising a plurality of gas discharge tubes containing an ionizable gas and means for producing an electrical discharge in the ionizable gas, said gas discharge tubes being connected, so as to permit the number of tubes activated to be controlled.

2. A variable capacitor according to claim 1, the electrodes comprising a plurality of plate elements, the plate elements of the first electrode being interleaved with the elements of the second electrode.

3. A variable capacitor according to claim 2, wherein said gas discharge means are located between each adjacent pair of interleaved plate elements.

4. A variable capacitor according to claim 1, further comprising voltage supply means connected to said gas discharge means and arranged to supply a voltage sufficient to activate said gas discharge means.

5. A variable capacitor according to claim 4, wherein said voltage supply means includes control means for selectively activating a predetermined number of said gas discharge tubes.

6. A variable capacitor according to claim 4 wherein said voltage supply means includes control means for controlling the voltage applied to said gas discharge tubes.

7. A variable capacitor according to claim 4 wherein said voltage supply means includes means for modulating the voltage applied to said gas discharge tubes.

8. A digital-to-analog converter including a variable capacitor comprising a first electrode, a second electrode separated therefrom and, located between the first and second electrodes, a plurality of gas discharge tubes, said gas discharge tubes being connected so as to permit the number of tubes activated to be controlled, and voltage supply means connected to said gas discharge tubes, said voltage supply means including control means for selectively activating a predetermined number of said gas discharge tubes in response to a digital input signal received by said control means.

9. An electrostatic loudspeaker comprising a diaphragm, at least one electrostatic drive element arranged to drive said diaphragm, said electrostatic drive element including a first electrode, a second electrode separated therefrom and, located between the first and second electrodes, a plurality of gas discharge tubes, and voltage supply means connected to at least one electrostatic drive element, said voltage supply means including control means for selectively activating a predetermined number of said gas discharge tubes in response to a digital input signal received by said control means.

10. A method of varying the capacitance of a capacitor comprising a first electrode, a second electrode separated therefrom and, located between the first and second electrodes, gas discharge means including a plurality of gas discharge tubes containing an ionizable gas and means for producing an electrical discharge in the ionizable gas, the method comprising controlling the electrical discharge produced in the ionizable gas by selectively activating a predetermined number of said gas discharge tubes.

11. A method according to claim 10, wherein the electrical discharge is controlled by adjusting the voltage applied to said gas discharge means.

12. A method according to claim 10 or claim 11, wherein the electrical discharge in controlled by modulating the voltage applied to said gas discharge tubes.

13. A method of converting a signal from digital to analog form by means of a variable capacitor comprising a first electrode, a second electrode separated therefrom and, located between the first and second electrodes, a plurality of gas discharge means, the method comprising applying a first voltage to said first and second electrodes, receiving a digital input signal, applying a second voltage to a predetermined number of said gas discharge means, to activate said predetermined number of said gas discharge means, and controlling the number of activated gas discharge means in response to said digital input signal, thereby generating an analog variation in the charge carried by the capacitor.

* * * * *